United States Patent
Yeh (10) Patent No.: US 10,977,116 B2
(45) Date of Patent: Apr. 13, 2021

(54) DATA ACCESS METHOD, MEMORY CONTROL CIRCUIT UNIT AND MEMORY STORAGE DEVICE

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

(*) Notice: Subject to any disclaimer, the term of this patent is extended or adjusted under 35 U.S.C. 154(b) by 152 days.

(21) Appl. No.: 16/153,828

(22) Filed: Oct. 8, 2018

(65) Prior Publication Data
US 2020/0065187 A1 Feb. 27, 2020

(30) Foreign Application Priority Data
Aug. 23, 2018 (TW) ................. 107129490

(51) Int. Cl.
*G06F 11/10* (2006.01)
*G11C 29/52* (2006.01)
*G11C 29/42* (2006.01)
*G11C 16/10* (2006.01)
*G11C 16/26* (2006.01)
(Continued)

(52) U.S. Cl.
CPC .......... *G06F 11/1068* (2013.01); *G11C 16/10* (2013.01); *G11C 16/26* (2013.01); *G11C 29/42* (2013.01); *G11C 29/44* (2013.01); *G11C 29/52* (2013.01); *G11C 16/0483* (2013.01)

(58) Field of Classification Search
None
See application file for complete search history.

(56) References Cited

U.S. PATENT DOCUMENTS 8,069,392 B1\* 11/2011 Norrie ............... H03M 13/6575
714/758
2009/0019321 A1\* 1/2009 Radke ................. G06F 11/1072
714/54
(Continued)

OTHER PUBLICATIONS

Li et al., Realizing Unequal Error Correction for NAND Flash Memory at Minimal Read Latency Overhead, IEEE, vol. 61, Issue: 5, Journal Article, pp. 354-358. (Year: 2014).\*
(Continued)

*Primary Examiner* — April Y Blair
*Assistant Examiner* — Dipakkumar B Gandhi
(74) *Attorney, Agent, or Firm* — JCIPRNET (57) ABSTRACT

A data access method, a memory control circuit unit and a memory storage device are provided. The method includes generating a first error correction code corresponding to received first data according to a first error correction encoding operation; and generating a second error correction code corresponding to received second data according to a second error correction encoding operation, wherein the second error correction code includes a first and a second partial error correction code. The method further includes writing the first data, the first error correction code and the second partial error correction code to a data bit area and a redundant bit area of a first physical programming unit respectively; and writing the second data and the first partial error correction code to the data bit area and the redundant bit area of a second physical programming unit respectively.

12 Claims, 6 Drawing Sheets

(51) Int. Cl.
  *G11C 29/44* (2006.01)
  *G06F 11/22* (2006.01)
  *G11C 16/04* (2006.01)

(56) References Cited

U.S. PATENT DOCUMENTS

| | | | | |
|---|---|---|---|---|
| 2011/0239082 | A1* | 9/2011 | Yang | G06F 11/1012 |
| | | | | 714/755 |
| 2013/0198577 | A1* | 8/2013 | Oh | H03M 13/356 |
| | | | | 714/704 |
| 2013/0238958 | A1* | 9/2013 | Radke | H03M 13/116 |
| | | | | 714/773 |
| 2014/0337681 | A1* | 11/2014 | Liang | G06F 11/1044 |
| | | | | 714/755 |
| 2014/0372833 | A1* | 12/2014 | Liang | G06F 11/1072 |
| | | | | 714/773 |
| 2014/0380117 | A1* | 12/2014 | Hirano | G11C 29/78 |
| | | | | 714/758 |
| 2016/0034351 | A1* | 2/2016 | Michael | G06F 12/0246 |
| | | | | 714/758 |
| 2016/0080002 | A1* | 3/2016 | Ramaraju | G06F 3/064 |
| | | | | 714/764 |

OTHER PUBLICATIONS

Li et al., Realizing Unequal Error Correction for NAND Flash Memory at Minimal Read Latency Overhead, IEEE, Journal Article, vol. 61, Issue 5, pp. 354-358. (Year: 2014).*

* cited by examiner

DATA ACCESS METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 107129490, filed on Aug. 23, 2018. The entirety of the above-mentioned patent application is hereby incorporated by reference herein and made a part of this specification.

BACKGROUND

1. Technology Field

The present invention relates to a data access method, a memory control circuit unit, and a memory storage device.

2. Description of Related Art

Along with the development of digital cameras, mobile phones and MP3 players in recent years, consumers' demand for storage media has rapidly increased. Because a rewritable non-volatile memory module (for example, a flash memory) has characteristics of non-volatile data, power saving, small size, and non-mechanical structure, it is very suitable for being built in the portable multimedia devices numerated above.

In general, to ensure the correctness of the data, data is first encoded and then written to the rewritable non-volatile memory module. When the data is read, the data is decoded to attempt to correct errors therein. The data will be sent back to a host system only if error bits in the data are all corrected. When the data is written to a physical programming unit of the rewritable non-volatile memory module, an error correction code (ECC) and/or an error detecting code (EDC) corresponding to the data may be generated, and the data may be written to a data bit area of the physical programming unit, while the ECC corresponding to the data may be written to a redundant bit area of the physical programming unit. The ECC generated by the encoding operation may be used to the correct errors in the data to be protected.

Due to process technology, the probability of the occurrence of error bits (i.e., an error rate) of data stored in physical programming units may be different. For example, in a triple-level cell (TLC) NAND type flash memory, generally, a reliability of a lower physical programming unit is higher than a reliability of a center physical programming unit, and the reliability of the center physical programming unit is higher than a reliability of an upper physical programming unit. That is, as the reliability of the physical programming unit decreases, the number of error bits increases, and the number of bits of the ECC required for correcting the data when the decoding operation is performed also increases. For example, for the lower reliability physical programming unit with higher reliability, the number of error bits thereof is relatively small, and the number of bits of the ECC required for correcting the data when the decoding operation is performed is less, and a storage space storing the ECC is also relatively small. On the contrary, for the upper physical programming unit with lower reliability, the number of error bits is relatively large, and the number of bits of the ECC required for correcting the data when the decoding operation is performed is greater, and the storage space required for storing the ECC is also relatively large.

In the conventional manner, the size of the redundant bit area used to store the ECC in the physical programming unit is fixed regardless of the reliability of the physical programming unit. However, for a physical program unit with low reliability, the reliability of the stored data can be improved if there is more storage space storing ECC with more powerful correcting capability.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data access method, a memory control circuit unit and a memory storage device.

According to an exemplary embodiment, a data access method for a rewritable non-volatile memory module including a plurality of physical programming units is provided, wherein each of the physical programming units includes a data bit area and a redundant bit area. The data access method includes receiving first data; generating a first error correction code (ECC) corresponding to the first data according to a first error correction encoding operation; receiving second data; generating a second ECC corresponding to the second data according to a second error correction encoding operation, wherein the second ECC includes a first partial ECC and a second partial ECC. The method further includes writing the first data to a data bit area of a first physical programming unit among the physical programming units and writing the first ECC and the second partial ECC of the second ECC to a redundant bit area of the first physical programming unit; and writing the second data to a data bit area of a second physical programming unit among the physical programming units and writing the first partial ECC to a redundant bit area of the second physical programming unit, wherein the number of bits of the first ECC is different from the number of bits of the second ECC.

According to an exemplary embodiment, a memory control circuit unit for controlling a rewritable non-volatile memory module including a plurality of physical programming units is provided, wherein each of the physical programming units includes a data bit area and a redundant bit area. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to receive first data and generate a first ECC corresponding to the first data according to a first error correction encoding operation. The memory management circuit is further configured to receive second data and generate a second ECC corresponding to the second data according to a second error correction encoding operation, wherein the second ECC includes a first partial ECC and a second partial ECC. The memory management circuit is further configured to write the first data to a data bit area of a first physical programming unit among the physical programming units and write the first ECC and the second partial ECC of the second ECC to a redundant bit area of the first physical programming unit. In addition, the memory management circuit is further configured to write the second data to a data bit area of a second physical programming unit among the physical programming units and write the first partial ECC to a redundant bit area of the second physical programming unit, wherein the number of bits of the first ECC is different from the number of bits of the second ECC.

According to an exemplary embodiment, a memory storage device including a connection interface unit, a rewritable non-volatile memory module and a memory control circuit unit is provided. The connection interface unit is configured to couple to a host system. The rewritable non-volatile memory module includes a plurality of physical programming units, and each of the physical programming units includes a data bit area and a redundant bit area. The memory control circuit unit is coupled to the connection interface unit and the rewritable non-volatile memory module. The memory control circuit unit is configured to receive first data and generate a first ECC corresponding to the first data according to a first error correction encoding operation. The memory control circuit unit is configured to receive second data and generate a second ECC corresponding to the second data according to a second error correction encoding operation, wherein the second ECC includes a first partial ECC and a second partial ECC. The memory control circuit unit is further configured to write the first data to a data bit area of a first physical programming unit among the physical programming units and write the first ECC and the second partial ECC of the second ECC to a redundant bit area of the first physical programming unit. In addition, the memory control circuit unit is further configured to write the second data to a data bit area of a second physical programming unit among the physical programming units and write the first partial ECC to a redundant bit area of the second physical programming unit, wherein the number of bits of the first ECC is different from the number of bits of the second ECC.

Based on the above, the present invention provides the data access method, the memory control circuit unit and the memory storage device that can write a part of the ECC generated by the physical programming unit with lower reliability to the redundant bit area of the physical programming unit with higher reliability according to the level of the reliability of the physical programming unit when the data is being written. Thereby, not only optimal decoding capability can be obtained, but also the storage space of the redundant bit area used for storing the ECC in each physical programming unit can be reasonably utilized.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage apparatus (also referred to as a memory storage system) includes a rewritable non-volatile memory module and a controller (also referred to as a control circuit). The memory storage device is usually used together with a host system, such that the host system can write data to or read data from the memory storage device.

Figure 1:
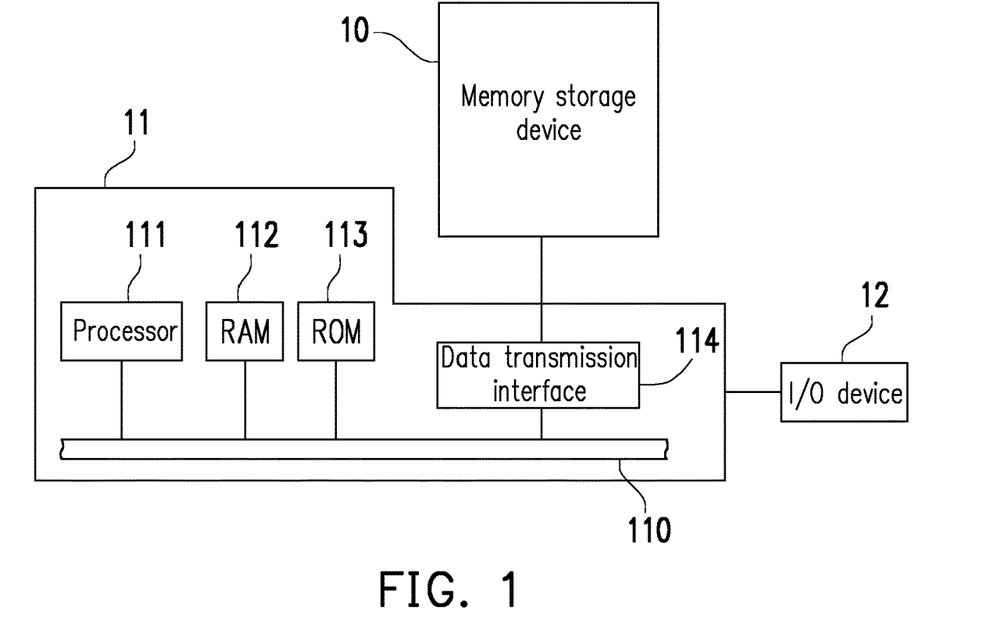
FIG. 1 is a schematic diagram illustrating a host system, a memory storage device and an input/output (I/O) device according to an exemplary embodiment.
Figure 2:
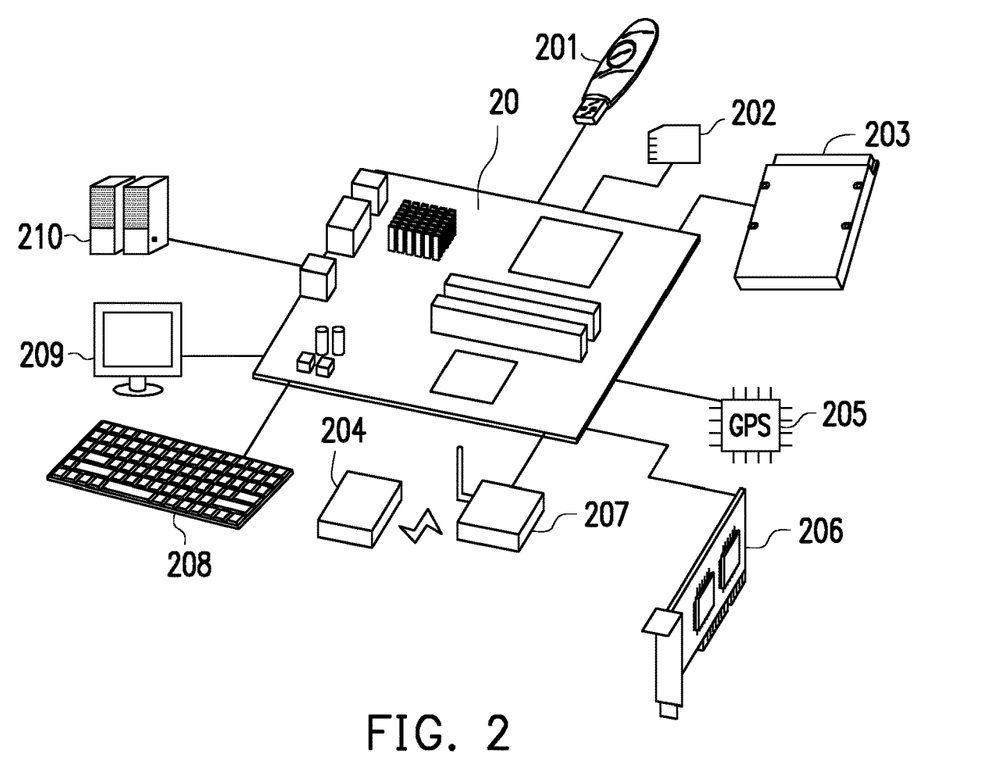
FIG. 2 is a schematic diagram illustrating a host system, a memory storage device and an I/O device according to another exemplary embodiment.

FIG. 1 is a schematic diagram illustrating a host system, a memory storage device and an input/output (I/O) device according to an exemplary embodiment. FIG. 2 is a schematic diagram illustrating a host system, a memory storage device and an I/O device according to another exemplary embodiment. Referring to FIG. 1 and FIG. 2, a host 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For instance, the host system 11 may store data in the memory storage device 10 or read data from the memory storage device 10 through the data transmission interface 114. Additionally, the host system 11 is coupled to an I/O device 12 through the system bus 110. For example, the host system 11 may transmit an output signal to the I/O device 12 or receive an input signal from the I/O device 12 through the system bus 110.

In the present exemplary embodiment, the processor 111, the RAM 112, the ROM 113 and the data transmission interface 114 may be disposed on a mainboard 20 of the host system 11. The number of the data transmission interface 114 may be one or a plurality. The mainboard 20 may be coupled to the memory storage device 10 in a wired or a wireless manner through the data transmission interface 114. The memory storage device 10 may be, for example, a flash drive 201, a memory card 202, or a solid state drive (SSD) 203 or a wireless memory storage device 204. The wireless memory storage device 204 may be, for example, a memory storage device based on a variety of wireless communication techniques, such as a near field communication (NFC) memory storage device, a WiFi memory storage device, a Bluetooth memory storage device or a low energy (LE) Bluetooth memory storage device (e.g., iBeacon). Additionally, the mainboard 20 may also be coupled to various I/O devices, such as a global positioning system (GPS) module 205, a network interface card 206, a wireless transmission device 207, a keyboard 208, a monitor 209 and a speaker 210 through the system bus 110. For instance, in an exemplary embodiment, the mainboard 20 may access the wireless memory storage device 204 through the wireless transmission device 207.

Figure 3:
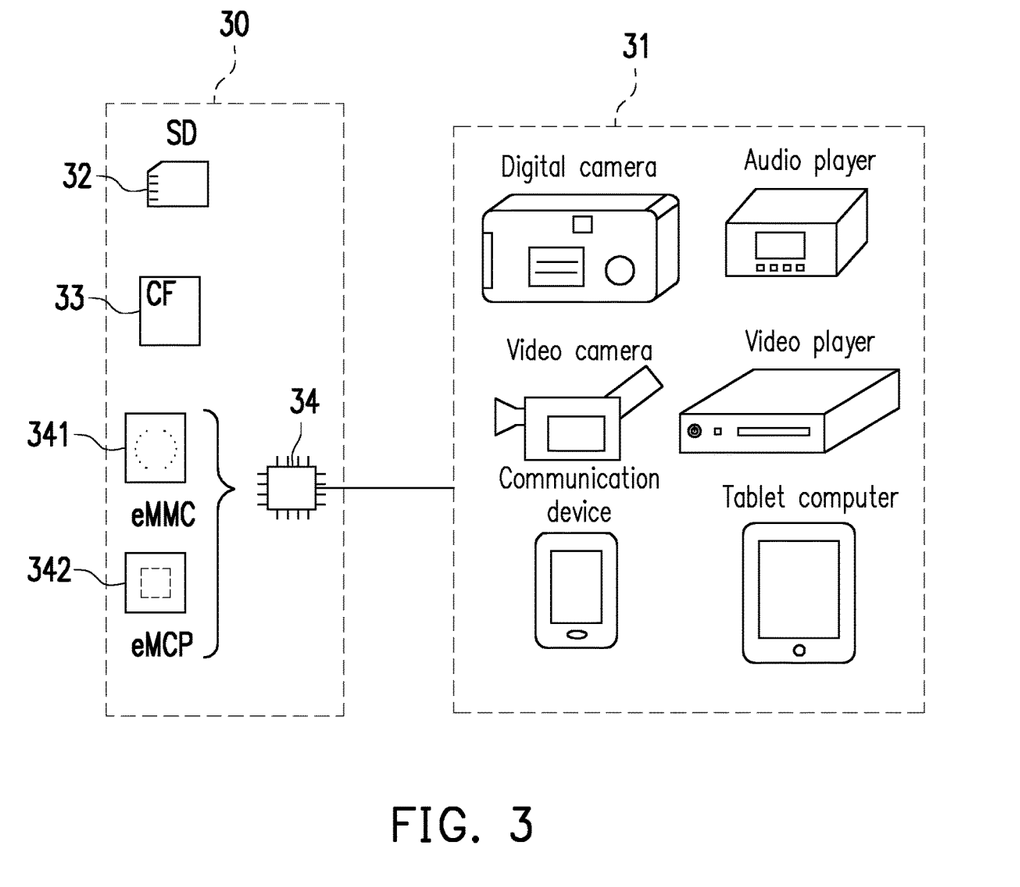
FIG. 3 is a schematic diagram illustrating a host system and a memory storage device according to another exemplary embodiment.

In an exemplary embodiment, the host system may substantially be any system collocated with the memory storage device for storing data. Although in the exemplary embodiments described above, the host system is illustrated as a computer system for description. However, FIG. 3 is a schematic diagram illustrating a host system and a memory storage device according to another exemplary embodiment of the invention. Referring to FIG. 3, in another exemplary embodiment, a host system 31 may also be a system, for example, a digital camera, a video camera, a communication device, an audio player, a video player or a tablet computer, and a memory storage device 30 may be various non-volatile memory storage devices used thereby, for example, an secure digital (SD) card 32, a compact flash (CF) card 33 or an embedded storage device 34. The embedded storage device 34 may include an embedded multi media card (eMMC) 341 and/or an embedded multi chip package (eMCP) storage device 342, in which a memory module is directly coupled to a substrate of the host system.

Figure 4:
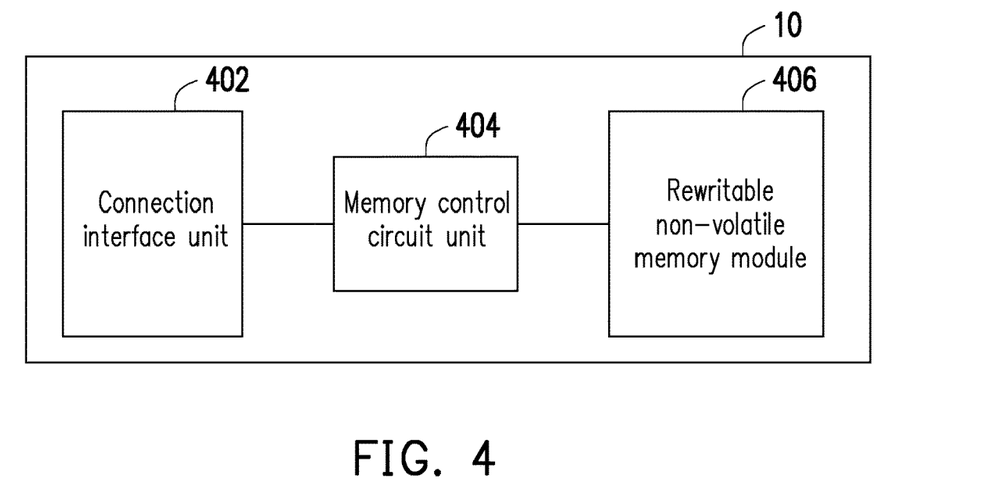
FIG. 4 is a schematic block diagram illustrating the memory storage device according to an exemplary embodiment.

FIG. 4 is a schematic block diagram illustrating the memory storage device according to an exemplary embodiment of the invention. Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. In the present exemplary embodiment, the connection interface unit 402 complies with a serial advanced technology attachment (SATA) standard. However, it should be understood that the invention is not limited thereto, and the connection interface unit 402 may also comply with a parallel advanced technology attachment (PATA) standard, an institute of electrical and electronic engineers (IEEE) 1394 standard, a peripheral component interconnect express (PCI Express) standard, a universal serial bus (USB) standard, a secure digital (SD) interface standard, an ultra high speed-I (UHS-I) interface standard, an ultra high speed-II (UHS-II) interface standard, a memory stick (MS) interface standard, a multi chip package (MCP) interface standard, a multi media card (MMC) interface standard, an embedded multi media card (eMMC) interface standard, a universal flash storage (UFS) interface standard, a compact flash (CF) interface standard, an integrated device electronics (IDE) standard, or other suitable standards. The connection interface unit 402 may be packaged with the memory control circuit unit 404 in one chip or laid outside a chip having the memory control circuit unit 404.

The memory control circuit unit 404 is configured to execute a plurality of logic gates or control commands which are implemented in a hardware form or a firmware form and perform operations such as data writing, data reading or data erasing in the rewritable non-volatile memory module 406 according to the commands of the host system 11.

The rewritable non-volatile memory module 406 is coupled to the memory control circuit unit 404 and configured to store data written by the host system 11. The rewritable non-volatile memory module 406 may be a single-level cell (SLC) NAND flash memory module (i.e., a flash memory module capable of storing data of 1 bit in one memory cell), a multi-level cell (MLC) NAND flash memory module (i.e., a flash memory module capable of storing data of 2 bits in one memory cell), a triple-level cell (TLC) NAND flash memory module (i.e., a flash memory module capable of storing data of 3 bits in one memory cell), any other flash memory module or any other memory module with the same characteristics.

Each memory cell in the rewritable non-volatile memory module 406 stores one or more bits by changing a voltage (which is referred to as a threshold voltage hereinafter). Specifically, there is a charge trapping layer between a control gate and a channel of each memory cell. Through applying a writing voltage to the control gate, an amount of electrons in the charge trapping layer may be changed, so as to change the threshold voltage of each memory cell. This operation of changing the threshold voltage may also be referred to as "writing data to the memory cell" or "programming the memory cell". Along with the change of the threshold voltage, each memory cell in the rewritable non-volatile memory module 406 has a plurality of storage states. Which storage state a memory cell belongs to may be determined through applying a reading voltage, so as to obtain the one or more bits stored by each memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more physical programming units. If each memory cell is capable of storing two or more bits, the physical programming units on the same word line may be categorized into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is faster than a writing speed of the upper physical programming unit, or a reliability of the lower physical programming unit is higher than a reliability of the upper physical programming unit.

In the present exemplary embodiment, a physical programming unit is the smallest unit for programming. Namely, the physical programming unit is the smallest unit for writing data. For instance, the physical programming units may be physical pages or physical sectors. In case the physical programming units are the physical pages, each of the physical programming units usually includes a data bit area and a redundant bit area. The data bit area includes a plurality of physical sectors for storing user data, and the redundant bit area is configured for storing system data (e.g., management data, such as error correcting codes). In the present exemplary embodiment, each data bit area contains 32 physical sectors, and a size of each physical sector is 512 bytes. However, in other exemplary embodiments, the data bit area may contain 8, 16, or a greater or a smaller number of physical sectors, and the size of each physical sector may be greater or smaller. On the other hand, a physical erasing unit is the smallest unit for erasing. Namely, each physical erasing unit has the least number of memory cells to be erased altogether. For instance, the physical erasing unit is a physical block.

Figure 5:
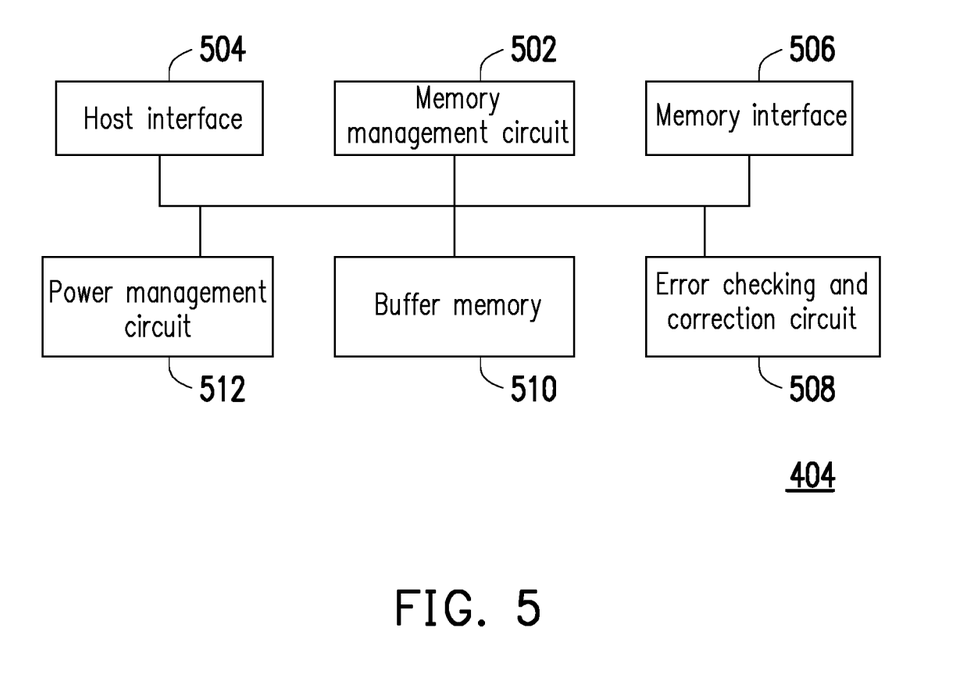
FIG. 5 is a schematic block diagram illustrating the memory control circuit unit according to an exemplary embodiment.

FIG. 5 is a schematic block diagram illustrating the memory control circuit unit according to an exemplary embodiment.

Referring to FIG. 5, the memory control circuit unit 404 includes a memory management circuit 502, a host interface 504, a memory interface 506 and an error checking and correction circuit 508.

The memory management circuit 502 is configured to control the overall operation of the memory control circuit unit 404. Specifically, the memory management circuit 502 has a plurality of control commands, and when the memory storage apparatus 10 is in operation, the control commands are executed to perform operations, such as data writing, data reading, and data erasing. The operations of the memory management circuit 502, when being described below, are similar to the operations of the memory controlling circuit unit 404.

In the present exemplary embodiment, the control commands of the memory management circuit 502 are implemented in a firmware form. For instance, the memory management circuit 502 has a microprocessor unit (not shown) and a read-only memory (not shown), and the control commands are burnt into the read-only memory. When the memory storage device 10 is in operation, the control commands are executed by the microprocessor unit to perform data operations, such as data writing, data reading and data erasing.

In another exemplary embodiment, the control commands of the memory management circuit 502 may also be stored in a specific area (e.g., a system area in the memory module exclusively used for storing the system data) of the rewritable non-volatile memory module 406 as program codes. Moreover, the memory management circuit 502 has a microprocessor unit (not shown), a read-only memory (not shown), and a random access memory (not shown). Specifically, the read-only memory has a boot code, and when the memory controller 404 is enabled, the microprocessor unit first executes the boot code to load the control commands stored in the rewritable non-volatile memory module 406 into the random access memory of the memory management circuit 502. Afterwards, the microprocessor unit executes the control commands for data operations, such as data writing, data reading and data erasing.

Additionally, in another exemplary embodiment, the control commands of the memory management circuit 502 may also be implemented in a hardware form. For example, the memory management circuit 502 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage memory cells of the rewritable non-volatile memory module 406 or groups thereof. The memory writing circuit is configured to issue a write command sequence to the rewritable non-volatile memory module 406 to write data to the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process data to be written to the rewritable non-volatile memory module 406 or data read from the rewritable non-volatile memory module 406. Each of the write command sequence, the read command sequence and the erase command sequence may include one or a plurality of program codes or instruction codes and may be configured to instruct the rewritable non-volatile memory module 406 to perform corresponding writing, reading and erasing operations. In an exemplary embodiment, the memory management circuit 502 may also issue other types of command sequences to the rewritable non-volatile memory module 406 to instruct it to perform corresponding operations.

The memory management circuit 502 may logically group a plurality of physical units of the rewritable non-volatile memory module 406 to a storage area and a replacement area. The physical units in the storage area are configured to store data, while the physical units in the replacement area are configured to replace damaged physical units in the storage area. For example, if data read from one of the physical units includes too many errors and is thus not correctable, the physical unit may be considered as a damaged physical unit. It should be noted that if there is no physical unit available in the replacement area, the memory management circuit 502 may declare that the whole memory storage device 10 enters a write protect state where no further data is allowed to be written to the memory storage device 10.

In the present exemplary embodiment, each physical unit refers to a physical erasing unit. However, in another exemplary embodiment, a physical unit may also refer to a physical address, a physical programming unit, or a combination of a plurality of continuous or discontinuous physical addresses. The memory management circuit 502 may assign a plurality of logical units to map the physical units in the storage area. In the present exemplary embodiment, each logical unit refers to a logical address. However, in another exemplary embodiment, a logical unit may also refer to a logical programming unit, a logical erasing unit or be composed of a plurality of continuous or discontinuous logical addresses. In addition, each of the logical units may be mapped to one or more physical units.

The memory management circuit 502 records a mapping relationship between the logical units and the physical units (which is also referred to as logical-physical address mapping information) in at least one logical-physical address mapping table. When the host system 11 is about to read data from the memory storage device 10 or write data to the memory storage device 10, the memory management circuit 502 may perform a data access operation on the memory storage device 10 according to the logical-physical address mapping table.

The host interface 504 is coupled to the memory management circuit 502 and configured to receive and identify commands and data transmitted by the host system 11. That is, the commands and the data transmitted by the host system 11 are transmitted to the memory management circuit 502 through the host interface 504. In the present exemplary embodiment, the host interface 504 complies with the SATA standard. However, it should be understood that the present invention is not limited thereto, and the host interface 504 may also comply with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard or other suitable standards for data transmission.

The memory interface 506 is coupled to the memory management circuit 502 and configured to access the rewritable non-volatile memory module 406. In other words, data to be written to the rewritable non-volatile memory module 406 is converted to an acceptable format for the rewritable non-volatile memory module 406 through the memory interface 506. Specifically, if the memory management circuit 502 is to access the rewritable non-volatile memory module 406, the memory interface 506 may transmit corresponding command sequences. For example, the command sequences may include a write command sequence instructing to write data, a read command sequence instructing to read data, an erase command sequence instructing to erase data, and other corresponding command sequences for instructing various memory operations (for example, changing a read voltage level, executing a garbage collection operation, or the like). These command sequences are generated by, for example, the memory management circuit 502 and transmitted to the rewritable non-volatile memory module 406 through the memory interface 506. These command sequences may include one or more signals or data on the bus. The signals or data may include instruction codes or program codes. For example, the read command sequence may include information, such as a read identification code, a memory address and so on.

The error checking and correcting circuit 508 is coupled to the memory management circuit 502 and configured to perform an error checking and correcting procedure to ensure data accuracy. To be specific, when the memory management circuit 502 receives a write command from the host system 11, the error checking and correcting circuit 508 generates an error correcting code (ECC) and/or error detecting code (EDC) corresponding to the write command for the data, and the memory management circuit 502 writes the data corresponding to the write command and the corresponding ECC and/or EDC to the rewritable non-volatile memory module 406. Subsequently, when reading the data from the rewritable non-volatile memory module 406, the memory management circuit 502 simultaneously reads the corresponding ECC and/or the EDC, and the error checking and correcting circuit 508 executes an error checking and correcting operation on the read data based on the ECC and/or the EDC. For descriptive convenience, the ECC and/or the EDC which are generated by the encoding operation are collectively referred to as an ECC.

In an exemplary embodiment, the memory control circuit unit 404 further includes a buffer memory 510 and a power management circuit 512.

The buffer memory 510 is coupled to the memory management circuit 502 and configured to temporarily store data and commands from the host system 11 or data from the rewritable non-volatile memory module 406. The power management circuit 512 is coupled to the memory management circuit 502 and configured to control the power of the memory storage device 10.

In the present exemplary embodiment, the error checking and correcting circuit 508 supports a low density parity check (LDPC) code. For example, the error checking and correcting circuit 508 may employ the LDPC code for coding and decoding. However, in another exemplary embodiment, the error checking and correcting circuit 508 may also support a BCH code, a convolutional code or a turbo code, which is not limited in the invention.

It is noted that in the following description, some terms may be replaced with corresponding abbreviations for ease of reading (see Table 1).

TABLE 1

| | |
|---|---|
| memory control circuit unit | MCCU |
| rewritable non-volatile memory module | RNVM |
| physical programming unit | PPU |
| upper physical programming unit | UPPU |
| middle physical programming unit | MPPU |
| lower physical programming unit | LPPU |
| data bit area | DBA |
| redundant bit area | RBA |

Figure 6:
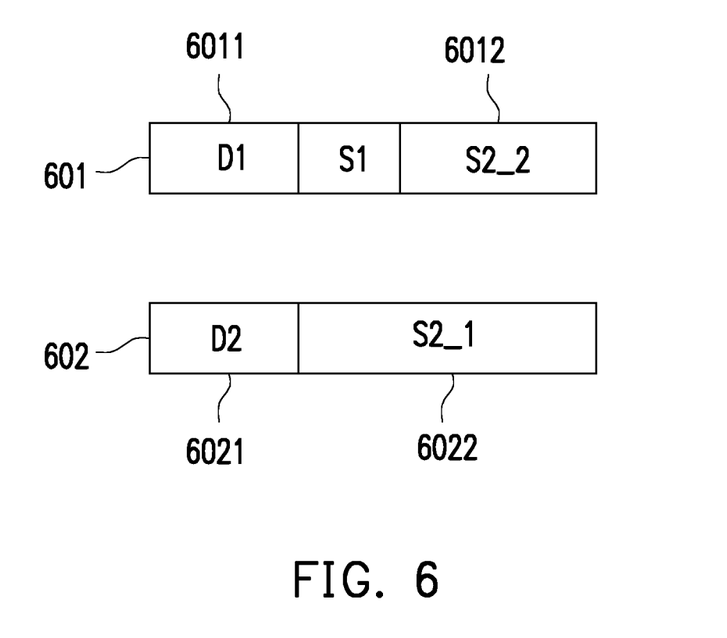
FIG. 6 is a schematic diagram of writing data to physical programming units according to an exemplary embodiment.

FIG. 6 is a schematic diagram of writing data to PPUs according to an exemplary embodiment.

Referring to FIG. 6, the MCCU 404 writing data to PPUs 601-602 of the RNVM 406 to generate corresponding error correcting codes (ECCs) is exemplified. When the MCCU 404 receives data and writes the data to the PPUs 601-602, the MCCU 404 encodes the data according to error correcting encoding operations to generate ECCs corresponding to the data, writes the data to DBAs of the PPUs 601-602 and writes the corresponding ECCs to RBAs of the PPUs 601-602. Afterwards, when the MCCU 404 has to read the data from the DBAs of the PPUs 601-602, the MCCU 404 reads the ECCs corresponding to the data from the RBAs of the PPUs 601-602 and performs error correction decoding operations on the data read from the DBAs of the PPUs 601-602 according to the ECCs corresponding to the data which are read from the RBAs of the PPUs 601-602, so as to attempt to correct error bits that may probably exist in the read data.

It should be noted that due to process technology, the probability of the occurrence of error bits (i.e., an error rate) of the data stored in the PPUs of the RNVM 406 may be different. For example, in a TLC NAND type flash memory, an UPPU, an LPPU and a MPPU have different levels of reliability. In general, the reliability of the LPPU is higher than the reliability of the MPPU, and the reliability of the MPPU is higher than the reliability of the UPPU. That is, as the reliability of the PPU decreases, the number of error bits which appear therein also increases, and the number of bits of the ECCs required for correcting the data when the decoding operation is performed also increases. For example, for the LPPU with higher reliability, the number of error bits appearing therein is relatively small, while the number of bits of the ECCs required for correcting the error bits in the data by performing the decoding operation is also reduced, and the storage space required for storing the ECCs is relatively small. On the contrary, for the UPPU with lower reliability, the number of error bits appearing therein is relatively large, while the number of bits of the ECCs required for correcting the error bits in the data by performing the decoding operation is also increased, and the storage space required for storing the ECCs is relatively large.

In the present exemplary embodiment, the RNVM 406 which is a TLC NAND type flash memory and includes the PPUs 601-602 is taken as an example. The PPU 601 (which is also referred to as a first PPU) includes a DBA 6011 and a RBA 6012, and the PPU 602 (which is also referred to as a second PPU) includes a DBA 6021 and a RBA 6022. In this case, the first PPU 601 belongs to an LPPU, and the second PPU 602 belongs to an UPPU. A reliability of the first PPU 601 is higher than that of the second PPU 602. In another exemplary embodiment, the first PPU 601 belongs to a MPPU, and the second PPU 602 belongs to an UPPU. The invention is not limited thereto.

In an exemplary embodiment, the MCCU 404 receives first data D1 and encodes the first data D1 according to a first error correction encoding operation to generate a first ECC S1 corresponding to the first data D1. The MCCU 404 receives second data D2 and encodes the second data D2 according to a second error correction encoding operation to generate a second ECC S2 corresponding to the second data D2. The second ECC S2 includes a first partial ECC S2_1 and a second partial ECC S2_2.

The MCCU 404 writes the first data D1 to the DBA 6011 of the first PPU 601 and writes the first ECC S1 and the second partial ECC S2_2 of the second ECC S2 to the RBA 6012 of the first PPU 601. Similarly, the MCCU 404 writes the second data D2 to the DBA 6021 of the second PPU 602 and writes the first partial ECC S2_1 of the second ECC S2 corresponding to the second data D2 to the RBA 6022 of the second PPU 602. Namely, in the present exemplary embodiment, the DBA 6011 of the first PPU 601 is configured to store the first data D1, and the RBA 6012 of the first PPU 601 is configured to store the first ECC S1 and the second partial ECC S2_2 of the second ECC S2. The DBA 6021 of the second PPU 602 is configured to store the second data D2, and the RBA 6022 of the second PPU 602 is configured to store the first partial ECC S2_1 of the second ECC S2.

In the present exemplary embodiment, the number of bits of the first ECC S1 is different from the number of bits of the second ECC S2. Specifically, since the first PPU 601 belongs to the LPPU, the number of error bits appearing thereto is relatively small, while the number of bits of the ECC required for correcting the error bits in the data by performing the decoding operation is also reduced, and the storage space required for storing the ECC is relatively small. Namely, the storage space of the RBA as required is relatively small. For the second PPU 602 belonging to the UPPU with lower reliability, the number of error bits appearing thereto is relatively large, while the number of bits of the ECC required for correcting the error bits in the data by performing the decoding operation is also increased, and the storage space required for storing the ECC is relatively large. Namely, the storage space of the RBA as required is relatively large. In other words, the number of bits of the first ECC S1 is smaller than the number of bits of the second ECC S2, and the storage space storing the first ECC S1 is smaller than the storage space storing the second ECC S2. In a condition that the storage space of the RBAs of the PPUs is fixed, and the number of bits of the second ECC S2 exceeds the storage space of the RBAs of the PPUs, the MCCU 404 writes the second partial ECC S2_2 of the second ECC S2 to the RBA 6012 of the first PPU 601.

In an exemplary embodiment, when the MCCU 404 reads the first data D1 from the DBA 6011 of the first PPU 601, the MCCU 404 reads the first ECC S1 corresponding to the first data D1 from the RBA 6012 of the first PPU 601, performs the first error correction decoding operation on the first data D1 according to the first ECC S1 and determines whether an error bit in the first data D1 read from the DBA 6011 of the first PPU 601 is correctable. When the error bit in the first data D1 read from the DBA 6011 of the first PPU 601 is capable of being corrected, the MCCU 404 transmits the corrected first data D1 to the host system 11.

In an exemplary embodiment, when the MCCU 404 reads the second data D2 from the DBA 6021 of the second PPU 602, the MCCU 404 reads the first partial ECC S2_1 of the second ECC S2 from the RBA 6022 of the second PPU 602, performs the second error correction decoding operation on the second data D2 according to the read first partial ECC S2_1 and determines whether an error bit in the second data D2 read from the DBA 6021 of the second PPU 602 is correctable. When the error bit in the second data D2 read from the DBA 6021 of the second PPU 602 is capable of being corrected according to the first partial ECC S2_1 read from the RBA 6022 of the second PPU 602, the MCCU 404 transmits the corrected second data D2 to the host system 11.

In another exemplary embodiment, when the error bit in the second data D2 read from the DBA 6021 of the second PPU 602 is incapable of being corrected according to the first partial ECC S2_1 read from the RBA 6022 of the second PPU 602, the MCCU 404 reads the second partial ECC S2_2 of the second ECC S2 from the RBA 6012 of the first PPU 601, performs the second error correction decoding operation on the second data D2 read from the DBA 6021 of the second PPU 602 according to the first partial ECC S2_1 of the second ECC S2 read from the RBA 6022 of the second PPU 602 and the second partial ECC S2_2 of the second ECC S2 read from the RBA 6012 of the first PPU 601 and determines whether the error bit in the second data D2 read from the DBA 6021 of the second PPU 602 is correctable. When the error bit in the second data D2 read from the DBA 6021 of the second PPU 602 is capable of being corrected according to the first partial ECC S2_1 read from the RBA 6022 of the second PPU 602 and the second partial ECC S2_2 read from the RBA 6012 of the first PPU 601, the MCCU 404 transmits the corrected second data D2 to the host system 11.

It should be noted that if the MCCU 404 performs the second error correction decoding operation on the second data D2 according to the first partial ECC S2_1 read from the RBA 6022 of the second PPU 602, and the second data D2 is capable of being corrected in the second error correction decoding operation, the MCCU 404 no longer reads the second partial ECC S2_2 of the second ECC S2 from the RBA 6012 of the first PPU 601.

Figure 7:
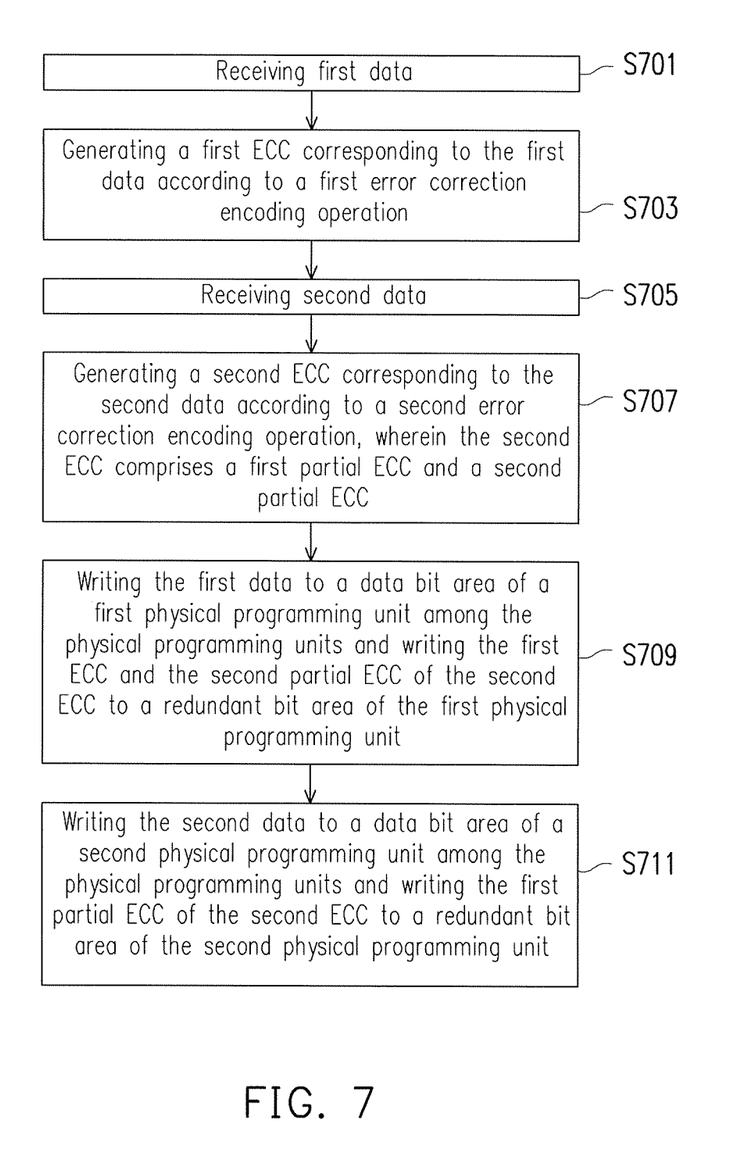
FIG. 7 is a flowchart of a data writing method according to an exemplary embodiment.

FIG. 7 is a flowchart of a data writing method according to an exemplary embodiment.

Referring to FIG. 7, in step S701, the MCCU 404 receives the first data D1. In step S703, the MCCU 404 generates the first ECC S1 corresponding to the first data D1 according to the first error correction encoding operation.

In step S705, the MCCU 404 receives the second data D2. In step S707, the MCCU 404 generates the second ECC S2 corresponding to the second data D2 according to the second error correction encoding operation. The second ECC S2 includes the first partial ECC S2_1 and the second partial ECC S2_2.

In step S709, the MCCU 404 writes the first data D1 to the DBA 6011 of the first PPU 601 and writes the first ECC S1 and the second partial ECC S2_2 of the second ECC S2 to the RBA 6012 of the first PPU 601.

In step S711, the MCCU 404 writes the second data D2 to the DBA 6021 of the second PPU 602 and writes the first partial ECC S2_1 of the second ECC S2 to the RBA 6022 of the second PPU 602. In the present exemplary embodiment, the first PPU 601 belongs to the L PPU, and the second PPU 602 belongs to the UPPU. The number of bits of the first ECC S1 is smaller than the number of bits of the second ECC S2. Namely, the storage space storing the first ECC S1 is smaller than the storage space storing the second ECC S2.

Figure 8:
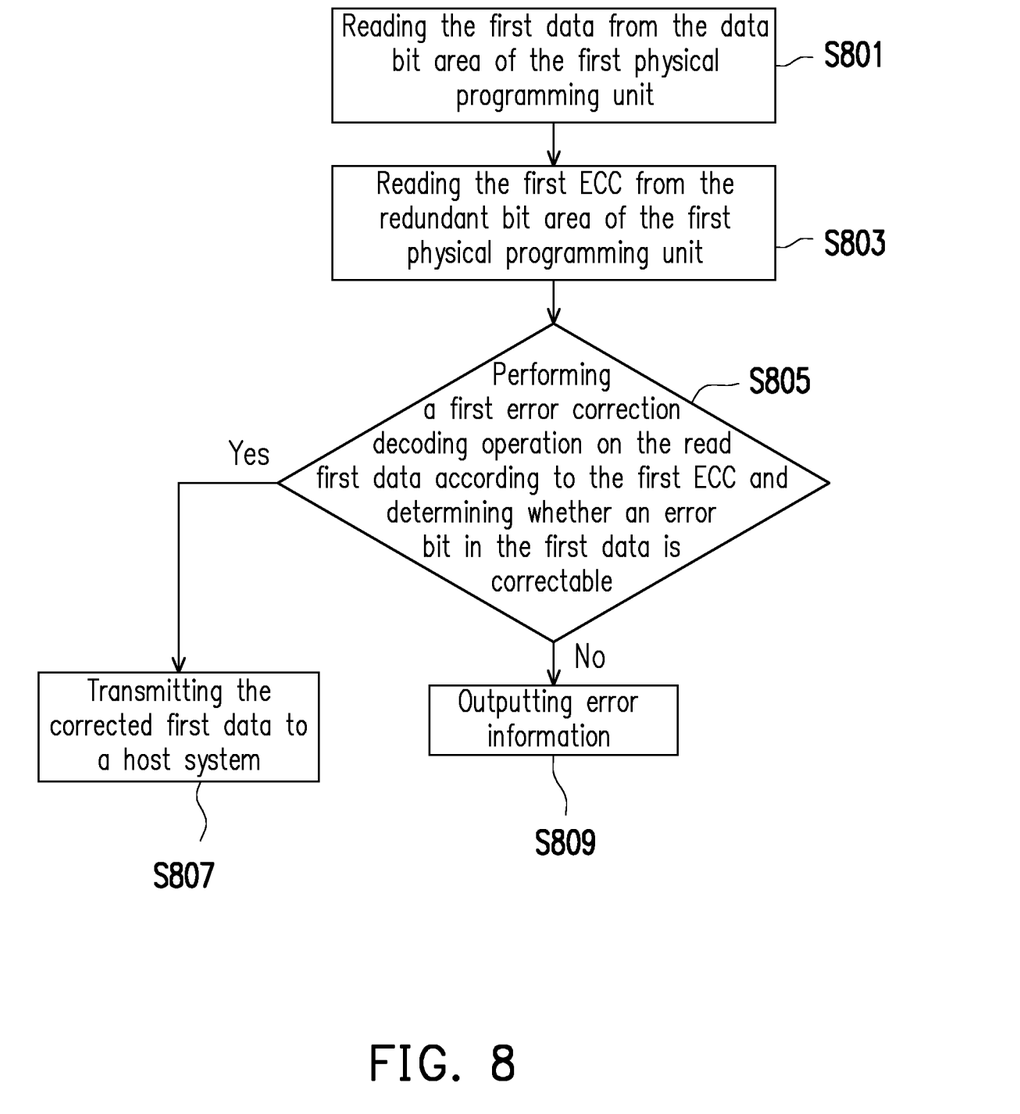
FIG. 8 is a flowchart of a method of reading first data according to an exemplary embodiment.

FIG. 8 is a flowchart of a method of reading the first data according to an exemplary embodiment.

Referring to FIG. 8, in step S801, the MCCU 404 reads the first data D1 from the DBA 6011 of the first PPU 601. In step S803, the MCCU 404 reads the first ECC S1 from the RBA 6012 of the first PPU 601. In step S805, the memory management circuit performs the first error correction decoding operation on the first data D1 read from the DBA 6011 of the first PPU 601 according to the first ECC S1 read from the RBA 6012 of the first PPU 601 and determines whether the error bit in the first data D1 read from the DBA 6011 of the first PPU 601 is correctable.

When the error bit in the first data D1 read from the DBA 6011 of the first PPU 601 is capable of being corrected, in step S807, the MCCU 404 transmits the corrected first data D1 to the host system 11.

When the error bit in the first data D1 read from the DBA 6011 of the first PPU 601 is incapable of being corrected, error information is output in step S809.

Figure 9:
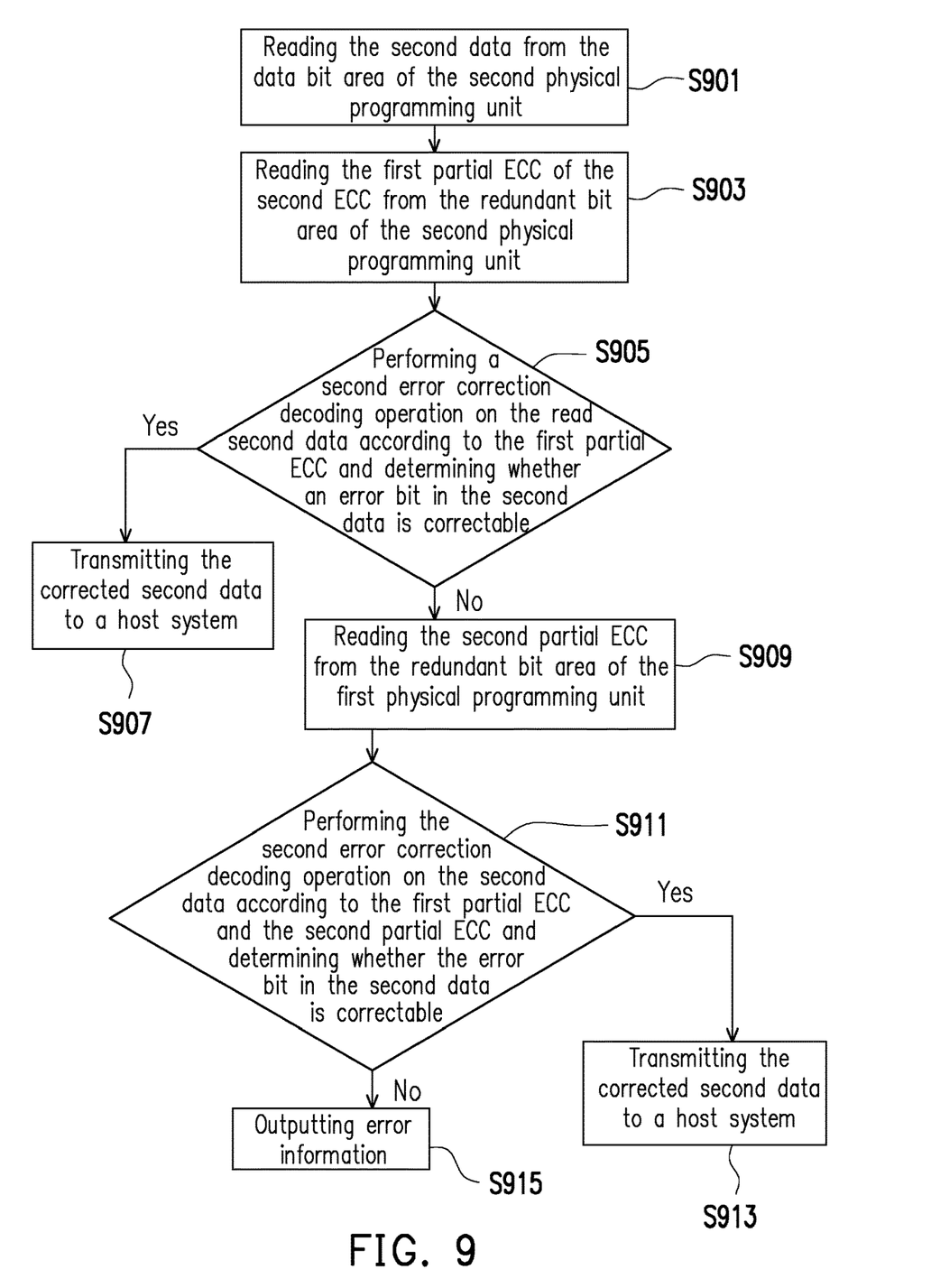
FIG. 9 is a flowchart of a method of reading second data according to an exemplary embodiment.

FIG. 9 is a flowchart of a method of reading the second data according to an exemplary embodiment.

Referring to FIG. 9, in step S901, the MCCU 404 reads the second data D2 from the DBA 6021 of the second PPU 602. In step S903, the MCCU 404 reads the first partial ECC S2_1 of the second ECC S2 from the RBA 6022 of the second PPU 602. In step S905, the memory management circuit 404 performs the second error correction decoding operation on the second data D2 read from the DBA 6021 of the second PPU 602 according to the first partial ECC S2_1 read from the RBA 6022 of the second PPU 602 and determines whether the error bit in the second data D2 read from the DBA 6021 of the second PPU 602 is correctable.

When the error bit in the second data D2 read from the DBA 6021 of the second PPU 602 is capable of being corrected according to the first partial ECC S2_1 read from the RBA 6022 of the second PPU 602, in step S907, the MCCU 404 transmits the corrected second data D2 to the host system 11.

When the error bit in the second data D2 read from the DBA 6021 of the second PPU 602 is incapable of being corrected according to the first partial ECC S2_1 read from the RBA 6022 of the second PPU 602, in step S909, the MCCU 404 reads the second partial ECC S2_2 from the RBA 6011 of the first PPU 601.

In step S911, the MCCU 404 performs the second error correction decoding operation on the second data D2 read from the DBA 6022 of the second PPU 602 according to the first partial ECC S2_1 read from the RBA 6022 of the second PPU 602 and the second partial ECC S2_2 read from the RBA 6021 of the first PPU 601 and determines whether the error bit in the second data D2 read from the DBA 6022 of the second PPU 602 is correctable.

When the error bit in the second data D2 read from the DBA 6021 of the second PPU 602 is capable of being corrected according to the first partial ECC S2_1 read from the RBA 6022 of the second PPU 602 and the second partial ECC S2_2 read from the RBA 6012 of the first PPU 601, in step S913, the MCCU 404 transmits the corrected second data D2 to the host system 11. When the error bit in the second data D2 read from the DBA 6021 of the second PPU 602 is incapable of being corrected according to the first partial ECC S2_1 read from the RBA 6022 of the second PPU 602 and the second partial ECC S2_2 read from the RBA 6012 of the first PPU 601, error information is output in step S915.

In light of the foregoing, the present invention provides the data access method, the MCCU and the memory storage device that can write a part of the ECC generated by the PPU with L reliability to the RBA of the PPU with higher reliability according to the level of the reliability of the PPU when the data is being written. Thereby, not only optimal decoding capability can be obtained, but also the storage space of the RBA used for storing the ECC in each PPU can be reasonably utilized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data access method for a rewritable non-volatile memory module being a triple-level cell (TLC) NAND flash memory module and comprising a plurality of physical programming units, which are grouped into lower physical programming units, center physical programming units and upper physical programming units, a reliability of the lower physical programming units and a reliability of the center physical programming units are higher than a reliability of the upper physical programming units, each of the physical programming units having a data bit area and a redundant bit area, and the data access method comprising:

receiving first data;

generating a first error correction code (ECC) corresponding to the first data according to a first error correction encoding operation;

receiving second data;

generating a second ECC corresponding to the second data according to a second error correction encoding operation, wherein the second ECC comprises a first partial ECC and a second partial ECC;

writing the first data to a data bit area of a first physical programming unit among the physical programming units and writing the first ECC and the second partial ECC of the second ECC to a redundant bit area of the first physical programming unit; and writing the second data to a data bit area of a second physical programming unit among the physical programming units and writing the first partial ECC of the second ECC to a redundant bit area of the second physical programming unit, wherein the number of bits of the first ECC is different from the number of bits of the second ECC, wherein the first physical programming unit belongs to the lower physical programming units or the center physical programming units, and the second physical programming unit belongs to the upper physical programming units.

2. The data access method as recited in claim 1, further comprising:

reading the first data from the data bit area of the first physical programming unit;

reading the first ECC from the redundant bit area of the first physical programming unit;

performing a first error correction decoding operation on the first data read from the data bit area of the first physical programming unit according to the first ECC read from the redundant bit area of the first physical programming unit and determining whether an error bit in the first data read from the data bit area of the first physical programming unit is correctable; and if the error bit in the first data read from the data bit area of the first physical programming unit is capable of being corrected, transmitting the corrected first data to a host system.

3. The data access method as recited in claim 1, further comprising:

reading the second data from the data bit area of the second physical programming unit;

reading the first partial ECC from the redundant bit area of the second physical programming unit;

performing a second error correction decoding operation on the second data read from the data bit area of the second physical programming unit according to the first partial ECC read from the redundant bit area of the second physical programming unit and determining whether an error bit in the second data read from the data bit area of the second physical programming unit is correctable; and if the error bit in the second data read from the data bit area of the second physical programming unit is capable of being corrected according to the first partial ECC read from the redundant bit area of the second physical programming unit, transmitting the corrected second data to a host system.

4. The data access method as recited in claim 3, further comprising:

if the error bit in the second data read from the data bit area of the second physical programming unit is incapable of being corrected according to the first partial ECC read from the redundant bit area of the second physical programming unit, reading the second partial ECC from the redundant bit area of the first physical programming unit;

performing the second error correction decoding operation on the second data read from the data bit area of the second physical programming unit according to the first partial ECC read from the redundant bit area of the second physical programming unit and the second partial ECC read from the redundant bit area of the first physical programming unit and determining whether the error bit in the second data read from the data bit area of the second physical programming unit is correctable; and if the error bit in the second data read from the data bit area of the second physical programming unit is capable of being corrected according to the first partial ECC read from the redundant bit area of the second physical programming unit and the second partial ECC read from the redundant bit area of the first physical programming unit, transmitting the corrected second data to the host system.

5. A memory control circuit unit for controlling a rewritable non-volatile memory module being a triple-level cell (TLC) NAND flash memory module and comprising a plurality of physical programming units, which are grouped into lower physical programming units, center physical programming units and upper physical programming units, a reliability of the lower physical programming units and a reliability of the center physical programming units are higher than a reliability of the upper physical programming units, each of the physical programming units having a data bit area and a redundant bit area, and the memory control circuit unit comprising:

a host interface, configured to couple to a host system;

a memory interface, configured to couple to the rewritable non-volatile memory module;

a memory management circuit, coupled to the host interface and the memory interface, wherein the memory management circuit is configured to receive first data and generate a first ECC corresponding to the first data according to a first error correction encoding operation, wherein the memory management circuit is configured to receive second data and generate a second ECC corresponding to the second data according to a second error correction encoding operation, wherein the second ECC comprises a first partial ECC and a second partial ECC, wherein the memory management circuit is configured to write the first data to a data bit area of a first physical programming unit among the physical programming units and write the first ECC and the second partial ECC of the second ECC to a redundant bit area of the first physical programming unit, and wherein the memory management circuit is configured to write the second data to a data bit area of a second physical programming unit among the physical programming units and write the first partial ECC of the second ECC to a redundant bit area of the second physical programming unit, wherein the number of bits of the first ECC is different from the number of bits of the second ECC, wherein the first physical programming unit belongs to the lower physical programming units or the center physical programming units, and the second physical programming unit belongs to the upper physical programming units.

6. The memory control circuit unit according to claim 5, wherein the memory management circuit is further configured to read the first data from the data bit area of the first physical programming unit and read the first ECC from the redundant bit area of the first physical programming unit, the memory management circuit is further configured to perform a first error correction decoding operation on the first data read from the data bit area of the first physical programming unit according to the first ECC read from the redundant bit area of the first physical programming unit, and the memory management circuit is further configured to determine whether an error bit in the first data read from the data bit area of the first physical programming unit is correctable, and if the error bit in the first data read from the data bit area of the first physical programming unit is capable of being corrected, the memory management circuit is further configured to transmit the corrected first data to the host system.

7. The memory control circuit unit according to claim 5, wherein the memory management circuit is further configured to read the second data from the data bit area of the second physical programming unit, the memory management circuit is further configured to read the first partial ECC from the redundant bit area of the second physical programming unit, the memory management circuit is further configured to perform a second error correction decoding operation on the second data read from the data bit area of the second physical programming unit according to the first partial ECC read from the redundant bit area of the second physical programming unit, and the memory management circuit is further configured to determine whether an error bit in the second data read from the data bit area of the second physical programming unit is correctable, and if the error bit in the second data read from the data bit area of the second physical programming unit is capable of being corrected according to the first partial ECC read from the redundant bit area of the second physical programming unit, the memory management circuit is further configured to transmit the corrected second data to the host system.

8. The memory control circuit unit according to claim 7, wherein if the error bit in the second data read from the data bit area of the second physical programming unit is incapable of being corrected according to the first partial ECC read from the redundant bit area of the second physical programming unit, the memory management circuit is further configured to read the second partial ECC from the redundant bit area of the first physical programming unit, the memory management circuit is further configured to perform the second error correction decoding operation on the second data read from the data bit area of the second physical programming unit according to the first partial ECC read from the redundant bit area of the second physical programming unit and the second partial ECC read from the redundant bit area of the first physical programming unit, and the memory management circuit is further configured to determine whether the error bit in the second data read from the data bit area of the second physical programming unit is correctable, and if the error bit in the second data read from the data bit area of the second physical programming unit is capable of being corrected according to the first partial ECC read from the redundant bit area of the second physical programming unit and the second partial ECC read from the redundant bit area of the first physical programming unit, the memory management circuit is further configured to transmit the corrected second data to the host system.

9. A memory storage device, comprising:

a connection interface unit, configured to couple to a host system;

a rewritable non-volatile memory module, being a triple-level cell (TLC) NAND flash memory module and comprising a plurality of physical programming units, which are grouped into lower physical programming units, center physical programming units and upper physical programming units, a reliability of the lower physical programming units and a reliability of the center physical programming units are higher than a reliability of the upper physical programming units, and each of the physical programming units comprising a data bit area and a redundant bit area; and a memory control circuit unit, coupled to the connection interface unit and the rewritable non-volatile memory module;

wherein the memory control circuit unit is configured to receive first data and generate a first ECC corresponding to the first data according to a first error correction encoding operation, wherein the memory control circuit unit is configured to receive second data and generate a second ECC corresponding to the second data according to a second error correction encoding operation, wherein the second ECC comprises a first partial ECC and a second partial ECC, wherein the memory control circuit unit is configured to write the first data to a data bit area of a first physical programming unit among the physical programming units and write the first ECC and the second partial ECC of the second ECC to a redundant bit area of the first physical programming unit, and wherein the memory control circuit unit is configured to write the second data to a data bit area of a second physical programming unit among the physical programming units and write the first partial ECC of the second ECC to a redundant bit area of the second physical programming unit, wherein the number of bits of the first ECC is different from the number of bits of the second ECC, wherein the first physical programming unit belongs to the lower physical programming units or the center physical programming units, and the second physical programming unit belongs to the upper physical programming units.

10. The memory storage device according to claim 9, wherein the memory control circuit unit is further configured to read the first data from the data bit area of the first physical programming unit and read the first ECC from the redundant bit area of the first physical programming unit, the memory control circuit unit is further configured to perform a first error correction decoding operation on the first data read from the data bit area of the first physical programming unit according to the first ECC read from the redundant bit area of the first physical programming unit, and the memory control circuit unit is further configured to determine whether an error bit in the first data read from the data bit area of the first physical programming unit is correctable, and if the error bit in the first data read from the data bit area of the first physical programming unit is capable of being corrected, the memory control circuit unit is further configured to transmit the corrected first data to the host system.

11. The memory storage device according to claim 9, wherein the memory control circuit unit is further configured to read the second data from the data bit area of the second physical programming unit, and the memory control circuit unit is further configured to read the first partial ECC from the redundant bit area of the second physical programming unit, the memory control circuit unit is further configured to perform a second error correction decoding operation on the second data read from the data bit area of the second physical programming unit according to the first partial ECC read from the redundant bit area of the second physical programming unit, and the memory control circuit unit is further configured to determine whether an error bit in the second data read from the data bit area of the second physical programming unit is correctable, and if the error bit in the second data read from the data bit area of the second physical programming unit is capable of being corrected according to the first partial ECC read from the redundant bit area of the second physical programming unit, the memory control circuit unit is further configured to transmit the corrected second data to the host system.

12. The memory storage device according to claim 11, wherein
- if the error bit in the second data read from the data bit area of the second physical programming unit is incapable of being corrected according to the first partial ECC read from the redundant bit area of the second physical programming unit, the memory control circuit unit is further configured to read the second partial ECC from the redundant bit area of the first physical programming unit,
- the memory control circuit unit is further configured to perform the second error correction decoding operation on the second data read from the data bit area of the second physical programming unit according to the first partial ECC read from the redundant bit area of the second physical programming unit and the second partial ECC read from the redundant bit area of the first physical programming unit, and the memory control circuit unit is further configured to determine whether the error bit in the second data read from the data bit area of the second physical programming unit is correctable, and
- if the error bit in the second data read from the data bit area of the second physical programming unit is capable of being corrected according to the first partial ECC read from the redundant bit area of the second physical programming unit and the second partial ECC read from the redundant bit area of the first physical programming unit, the memory control circuit unit is further configured to transmit the corrected second data to the host system.

* * * * *